US011410896B2

(12) United States Patent
Hashimoto et al.

(10) Patent No.: US 11,410,896 B2
(45) Date of Patent: Aug. 9, 2022

(54) GLASS INTERPOSER MODULE, IMAGING DEVICE, AND ELECTRONIC APPARATUS

(71) Applicant: SONY CORPORATION, Tokyo (JP)

(72) Inventors: Mitsuo Hashimoto, Kanagawa (JP); Akira Akiba, Kanagawa (JP); Hidetoshi Kabasawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 145 days.

(21) Appl. No.: 16/072,410

(22) PCT Filed: Jan. 25, 2017

(86) PCT No.: PCT/JP2017/002420
§ 371 (c)(1),
(2) Date: Jul. 24, 2018

(87) PCT Pub. No.: WO2017/138350
PCT Pub. Date: Aug. 17, 2017

(65) Prior Publication Data
US 2018/0366385 A1 Dec. 20, 2018

(30) Foreign Application Priority Data

Feb. 8, 2016 (JP) .............................. JP2016-021536

(51) Int. Cl.
*H01L 31/0232* (2014.01)
*H01L 23/15* (2006.01)
(Continued)

(52) U.S. Cl.
CPC .............. *H01L 23/15* (2013.01); *H01L 23/29* (2013.01); *H01L 23/31* (2013.01); *H01L 24/94* (2013.01);
(Continued)

(58) Field of Classification Search
CPC ... H01L 31/0232; H01L 31/024; H01L 23/15; H01L 27/14; G02B 6/26; H04N 5/2254; H04N 5/2258; H04N 5/3745
See application file for complete search history.

(56) References Cited

U.S. PATENT DOCUMENTS 6,703,132 B1 * 3/2004 Yasuda ............... B81C 1/00896
324/244
9,136,293 B2 * 9/2015 Yee .................... H01L 27/14683
(Continued)

FOREIGN PATENT DOCUMENTS

CN 1622334 A 6/2005
CN 101064329 A 10/2007
(Continued)

OTHER PUBLICATIONS http://www.ioffe.ru/SVA/NSM/Semicond/Si/thermal.html (Year: 2011).*
(Continued)

*Primary Examiner* — Eric K Ashbahian
(74) *Attorney, Agent, or Firm* — Chip Law Group

(57) ABSTRACT

The present disclosure relates to a glass interposer module, an imaging device, and an electronic apparatus capable of reducing occurrence of distortion caused by thermal expansion during manufacture. A light transmissive member is charged between a glass interposer and a CMOS image sensor (CIS). Since rigidity of the glass interposer can be enhanced by this configuration, it is possible to suppress deflection of the CIS and also reduce influence of distortion given to a gyro sensor and the like which are equipped on the glass interposer, and therefore, erroneous detection of a gyro signal can be reduced. The present disclosure can be applied to a glass interposer module.

21 Claims, 12 Drawing Sheets

(51) Int. Cl.
  *H01L 27/14*    (2006.01)
  *H01L 27/146*   (2006.01)
  *H01L 23/29*    (2006.01)
  *H01L 23/31*    (2006.01)
  *H01L 23/00*    (2006.01)
  *H01L 31/0203*  (2014.01)

(52) U.S. Cl.
  CPC ........ *H01L 27/14* (2013.01); *H01L 27/14618* (2013.01); *H01L 27/14625* (2013.01); *H01L 31/0203* (2013.01); *H01L 24/13* (2013.01); *H01L 24/16* (2013.01); *H01L 2224/13101* (2013.01); *H01L 2224/13144* (2013.01); *H01L 2224/13147* (2013.01); *H01L 2224/16225* (2013.01); *H01L 2224/32225* (2013.01); *H01L 2224/73204* (2013.01); *H01L 2224/81205* (2013.01); *H01L 2924/097* (2013.01); *H01L 2924/15311* (2013.01); *H01L 2924/15788* (2013.01); *H01L 2924/181* (2013.01)

(56) References Cited

U.S. PATENT DOCUMENTS

| | | | |
|---|---|---|---|
| 9,838,600 B1* | 12/2017 | Tam | H04N 5/23238 |
| 9,899,442 B2* | 2/2018 | Katkar | H01L 27/14636 |
| 2005/0051859 A1 | 3/2005 | Hoffman | |
| 2005/0110107 A1* | 5/2005 | Yamamoto | H01L 27/14634 257/433 |
| 2006/0092514 A1* | 5/2006 | Koo | G02B 13/001 359/557 |
| 2006/0164732 A1* | 7/2006 | Lee | G02B 3/14 359/676 |
| 2007/0085180 A1* | 4/2007 | Kim | H01L 27/14618 257/678 |
| 2007/0252227 A1* | 11/2007 | Fukuda | H01L 27/14618 257/432 |
| 2008/0245968 A1* | 10/2008 | Tredwell | H01L 27/14663 250/370.09 |
| 2009/0046183 A1* | 2/2009 | Nishida | H01L 21/6835 348/294 |
| 2010/0165134 A1 | 7/2010 | Dowski, Jr. et al. | |
| 2012/0241593 A1* | 9/2012 | Ochi | H01L 27/14618 250/208.1 |
| 2013/0032914 A1* | 2/2013 | Iwasaki | H01L 27/14621 257/432 |
| 2013/0278810 A1* | 10/2013 | Wolterink | G02B 13/003 348/335 |
| 2013/0308030 A1* | 11/2013 | Fujita | H04N 5/3456 348/302 |
| 2014/0037247 A1* | 2/2014 | Math | G02B 6/4228 385/52 |
| 2014/0061865 A1* | 3/2014 | Takachi | H01L 24/94 257/620 |
| 2014/0204541 A1* | 7/2014 | Kozuki | H03H 9/1021 361/748 |
| 2014/0268520 A1* | 9/2014 | Murakami | C03C 8/04 361/679.01 |
| 2014/0376097 A1 | 12/2014 | Yamashita et al. | |
| 2015/0130008 A1* | 5/2015 | Muro | G02B 5/208 257/432 |
| 2015/0341531 A1 | 11/2015 | Senda | |
| 2016/0037034 A1* | 2/2016 | Inasaki | C07F 9/58 348/360 |
| 2016/0116653 A1 | 4/2016 | Murayama et al. | |
| 2016/0225809 A1* | 8/2016 | Vittu | H04N 5/2257 |
| 2017/0092682 A1* | 3/2017 | Choi | H04N 5/378 |
| 2018/0246258 A1* | 8/2018 | Shiraiwa | B29D 11/00307 |

FOREIGN PATENT DOCUMENTS

| | | |
|---|---|---|
| CN | 101473439 A | 7/2009 |
| CN | 103579278 A | 2/2014 |
| CN | 103681711 A | 3/2014 |
| CN | 105100585 A | 11/2015 |
| EP | 1536478 A2 | 6/2005 |
| EP | 2016620 A2 | 1/2009 |
| JP | 08-172177 A | 7/1996 |
| JP | 2005-158948 A | 6/2005 |
| JP | 2005-200289 A | 7/2005 |
| JP | 2007-299929 A | 11/2007 |
| JP | 2008-211225 A | 9/2008 |
| JP | 2009-021542 A | 1/2009 |
| JP | 2010-021283 A | 1/2010 |
| JP | 4664372 B2 | 4/2011 |
| JP | 2012-114370 A | 6/2012 |
| JP | 2012-175408 A | 9/2012 |
| JP | 2013-175540 A | 9/2013 |
| JP | 2013-175626 A | 9/2013 |
| JP | 2014-045142 A | 3/2014 |
| JP | 2014-127472 A | 7/2014 |
| JP | 2015-028621 A | 2/2015 |
| JP | 2015-149511 A | 8/2015 |
| JP | 2015-220690 A | 12/2015 |
| KR | 10-2005-0050562 A | 5/2005 |
| KR | 10-2009-0012240 A | 2/2009 |
| KR | 10-2014-0029162 A | 3/2014 |
| KR | 10-2016-0013124 A | 2/2016 |
| TW | 304396 B | 3/2005 |
| TW | 200813593 A | 3/2008 |
| TW | 201512265 A | 4/2015 |
| WO | 2007/137293 A2 | 11/2007 |
| WO | 2008/020899 A1 | 2/2008 |
| WO | 2013/133225 A1 | 9/2013 |
| WO | 2015/002185 A1 | 1/2015 |

OTHER PUBLICATIONS

International Search Report and Written Opinion of PCT Application No. PCT/JP2017/002420, dated Mar. 7, 2017, 15 pages of ISRWO.

* cited by examiner

GLASS INTERPOSER MODULE, IMAGING DEVICE, AND ELECTRONIC APPARATUS

CROSS REFERENCE TO RELATED APPLICATIONS

This application is a U.S. National Phase of International Patent Application No. PCT/JP2017/002420 filed on Jan. 25, 2017, which claims priority benefit of Japanese Patent Application No. JP 2016-021536 filed in the Japan Patent Office on Feb. 8, 2016. Each of the above-referenced applications is hereby incorporated herein by reference in its entirety.

TECHNICAL FIELD

The present disclosure relates to a glass interposer module, an imaging device, and an electronic apparatus, and particularly relates to a glass interposer module, an imaging device, and an electronic apparatus in which distortion caused by thermal expansion during manufacture is reduced.

BACKGROUND ART

In a camera module of the related art, adopted is a structure using a glass substrate (glass interposer) in order to protect a light receiving surface and reduce thermal stress at the time of bonding (see Patent Documents 1 and 2).

CITATION LIST

Patent Document

Patent Document 1: Japanese Patent No. 4664372
Patent Document 2: Japanese Patent Application Laid-Open No. 2014-127472

SUMMARY OF THE INVENTION

Problems to be Solved by the Invention

However, according to a technology disclosed in Patent Document 1, in a case where a gyro sensor used to correct blurring caused by camera shake is mounted together with an image sensor on a glass substrate, warpage may be caused during a manufacturing process and during use because a linear expansion coefficient of the glass substrate differs from silicon used in the image sensor and gyro sensor, thereby also causing distortion in the mounted gyro sensor. The distortion may generate an erroneous gyro signal, and there is a possibility that blurring caused by camera shake cannot be corrected.

Additionally, in a technology disclosed in Patent Document 2, a chip (a memory chip, a logic chip, or a complementary metal oxide semiconductor (CMOS) image sensor (CIS)) chip, a micro electro mechanical systems (MEMS) chip, or the like) is provided on a light receiving surface of a glass substrate and is connected to a substrate on a back side of the glass substrate with a through electrode. Therefore, since the light receiving surface is exposed without contacting the glass substrate, a protective glass substrate or the like is separately needed, and there is a possibility that height reduction cannot be achieved when modularized.

The present disclosure is made in view of the above-described situations, and in a case where a gyro sensor is mounted together with an image sensor on a glass substrate, the present invention is directed to achieving: reduction of distortion caused by a difference in a linear expansion coefficient between the glass substrate and silicon used in the gyro sensor and image sensor; and height reduction by having a configuration in which a light receiving surface of an equipped chip contacts the glass substrate.

Solutions to Problems

A glass interposer module according to one embodiment of the present disclosure includes: an image sensor adapted to capture an image; a glass interposer equipped with the image sensor in a manner facing a light receiving surface of the image sensor; and a light transmissive member charged between the light receiving surface of the image sensor and the glass interposer.

The glass interposer can be equipped with a physical sensor.

The physical sensor can be arranged at a position facing an end portion of the glass interposer connected by a flexible printed circuit (FPC) while interposing the image sensor.

The physical sensor can include a material having a linear expansion coefficient of 0.7 to $6 \times 10^{-6} (K^{-1})$.

A driving driver for an auto focus (AF) mechanism or an optical image stabilizer (OIS) mechanism can be equipped on the glass interposer.

A pad for heat dissipation can be equipped on the glass interposer.

A glass wafer level lens can be bonded to the glass interposer.

An infrared (IR) cut filter can be attached or applied to the glass interposer.

A through glass via can be formed in the glass interposer, and a conductive member can be formed on or charged to an inner wall of the through glass via.

A through glass via can be formed in the glass interposer, and a light absorbing film can be formed on or a light absorbing agent can be charged to an inner wall of the through glass via.

The through glass via where the light absorbing film is formed or the light absorbing member is charged can be arranged at a distance closer to an inner light receiving surface than the through glass via where the conductive member is formed or the conductive member is charged is arranged.

The image sensor can include a plurality of light receiving portions.

A region located between the plurality of light receiving portions can be connected by bump-connection.

A redistribution layer can be formed on a back side of the image sensor.

A through glass via or a cavity can be formed in the glass interposer.

The glass interposer can be alkali-free glass.

The glass interposer can include a material having a linear expansion coefficient of 0.7 to $6 \times 10^{-6} (K^{-1})$.

The glass interposer can include a material having an Abbe number of 40 or more.

The light transmissive member can include a material having a Young's modulus of 0.1 to 10 GPa.

The light transmissive member can include a material having an Abbe number of 40 or more.

The glass interposer can include a material having an Abbe number of 40 or more and the light transmissive member can include a material having an Abbe number of 25 or more.

The light transmissive member can include a material not containing a halogen element.

A digital camera, a mobile information terminal, or an in-vehicle camera according to the present disclosure is equipped with the glass interposer module of the present disclosure.

An imaging device according to one aspect of the present disclosure is an imaging device including: an image sensor adapted to capture an image; a glass interposer equipped with the image sensor in a manner facing a light receiving surface of the image sensor; and a light transmissive member charged between the light receiving surface of the image sensor and the glass interposer.

An electronic apparatus according to one aspect of the present disclosure is an electronic apparatus including: an image sensor adapted to capture an image; a glass interposer equipped with the image sensor in a manner facing a light receiving surface of the image sensor; and a light transmissive member charged between the light receiving surface of the image sensor and the glass interposer.

According to one aspect of the present disclosure, an image is captured by the image sensor, the glass interposer is equipped with the image sensor in a manner facing the light receiving surface of the image sensor, and the light transmissive member is charged between the light receiving surface of the image sensor and the glass interposer.

According to one aspect of the present disclosure, it is possible to reduce occurrence of distortion caused by thermal expansion during manufacture of the glass interposer module.

Effects of the Invention

According to one aspect of the present disclosure, it is possible to: reduce distortion caused by a difference in a linear expansion coefficient between a glass substrate and silicon used in a gyro sensor and an image sensor; and achieve height reduction by having a configuration in which a light receiving surface of an equipped chip contacts the glass substrate.

MODE FOR CARRYING OUT THE INVENTION

In the following, preferred embodiments of the present disclosure will be described in detail with reference to the accompanying drawings. Note that, in the present specification and the drawings, a constituent element having substantially a same functional configuration will be denoted by a same reference sign and repetition of the same description will be omitted.

Additionally, note that the description will be provided in the following order.
1. Embodiments in Related art
2. First Embodiment
3. Second Embodiment
4. Third Embodiment
5. Fourth Embodiment
6. Fifth Embodiment
7. Sixth Embodiment
8. Seventh Embodiment
9. Eighth Embodiment
10. Ninth Embodiment
11. Exemplary Application 1. Embodiments in Related Art FIGS. 1 and 2 are exemplary configurations of camera modules each including a glass interposer module according first and second embodiments in the related art corresponding to Patent Documents 1 and 2.

Figure 1:
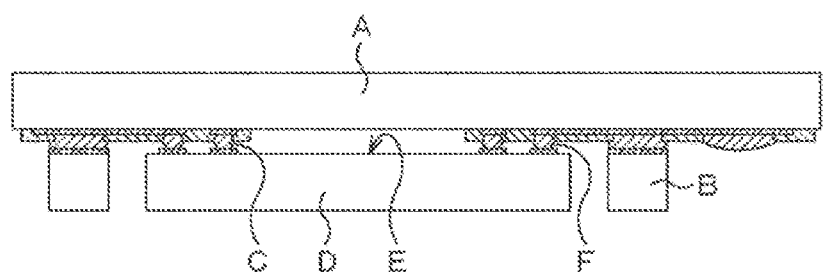
FIG. 1 is a diagram illustrating a first exemplary configuration of a camera module using a glass substrate in the related art.
Figure 2:
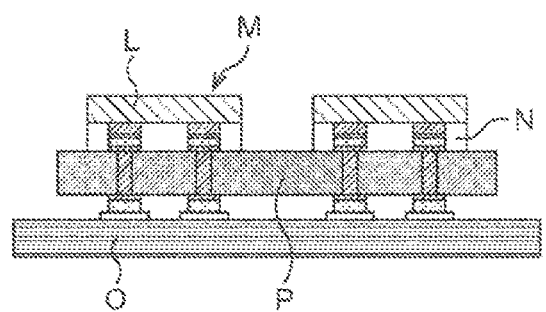
FIG. 2 is a diagram illustrating a second exemplary configuration of the camera module using the glass substrate in the related art.

In FIG. 1, light is incident downward from an upper side of the drawing. An image sensor D is connected to a lower side of a transparent substrate (glass substrate) A in the drawing via a sealing ring C and a solder bump F. The image sensor D is provided such that a light receiving surface E faces an incident direction of incident light. Additionally, a semiconductor chip element (LCR) B is equipped at a lower portion of the transparent substrate A in the drawing and next to the image sensor D.

With this configuration, the light receiving surface E can be protected by the transparent substrate A, and thermal stress at the time of bonding can be reduced.

However, in a case of having the configuration of FIG. 1, warpage may be caused by a difference in a thermal expansion coefficient between the transparent substrate A and the image sensor D, and for example, in a case where the semiconductor chip element B is not the LCR but a gyro sensor or the like, erroneous detection may be caused in a gyro signal of the gyro sensor and there is a possibility that a proper gyro signal cannot be output.

Accordingly, as illustrated in FIG. 2, proposed in the Patent Document 2 is a configuration in which a plurality of electronic components having terminals on a surface of a transparent substrate (glass substrate) P is stacked interposing a resin layer N while an upper side of a semiconductor chip element L in the drawing is set as a light receiving surface M, and a plurality of layers including a terminal, a solder layer, and a terminal is stacked and connected by performing heating and load application at the same time without solder bonding, and then the plurality of electronic components (between terminals) is solder-bonded at a time, thereby suppressing occurrence of resin biting (that is a state in which a resin enters a space between the terminals, and the connected state between the terminal, solder layer, and terminal is eliminated).

However, in the case of such a configuration, the light receiving surface M of the semiconductor chip element L is not connected to the transparent substrate P, and therefore, a protective transparent layer is separately needed, and consequently, there is a possibility that height reduction cannot be achieved when modularized.

2. First Embodiment

Next, a camera module to which the glass interposer module of the present disclosure is applied will be described with reference to FIG. 3. Note that an upper portion of FIG. 3 is a top view of the camera module, and a lower portion of FIG. 3 is a cross section of a left portion of the camera module taken along line AA in FIG. 3.

A camera module 11 includes a glass interposer (IP) 31 as a whole. The glass IP 31 is provided with an insulation layer 55 having an opening at a center of a back surface thereof.

Figure 3:
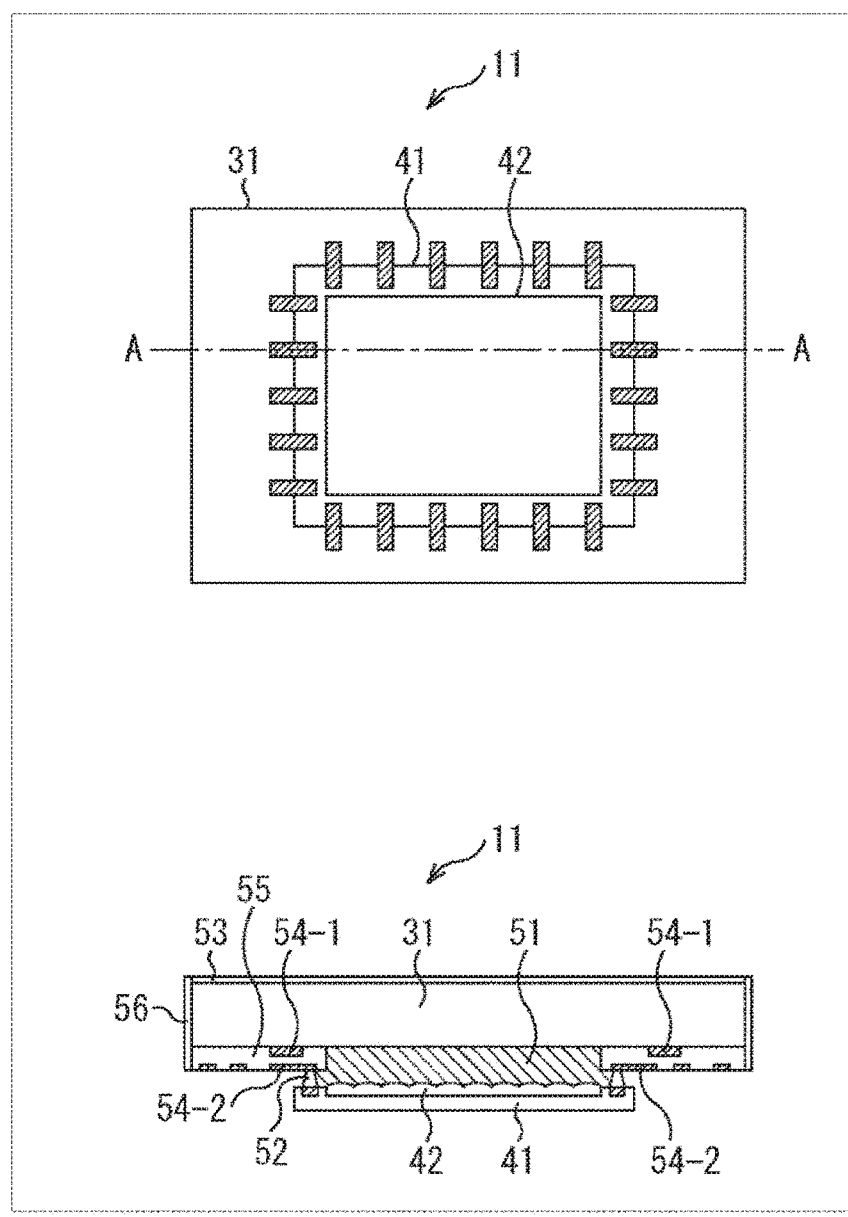
FIG. 3 is a diagram illustrating an exemplary configuration of a camera module according to a first embodiment to which the present disclosure is applied.

The insulation layer 55 is provided with wiring layers 54-1 and 54-2 respectively on an upper surface portion and a lower surface portion thereof in FIG. 3, and the wiring layer 54-2 out of these wiring layers is electrically connected to a CMOS image sensor (CIS) 41 provided at the center of the back surface via a bump 52.

The bump 52 includes gold (Au) or the like and bonded by Au bump bonding with ultrasonic waves, for example. Incidentally, the bump 52 may be an Au bump, a solder bump, a Cu core bump, or a combination thereof.

The CIS 41 has an upper surface portion provided with a color filter 42, and light corresponding to each of wavelengths of R, G, and B is transmitted per pixel in a Bayer array, for example.

The glass IP 31 has an upper surface pasted or applied with an IR cut filter 53 that shields only light having a wavelength corresponding to infrared light.

Additionally, the glass IP 31 has a side surface portion provided with a light absorbing member 56 that suppresses incidence of stray light by absorbing light incident from a side surface direction.

A light transmissive member 51 is charged between the glass IP 31 and the CIS 41 (having the color filter 42 provided on the upper surface thereof).

The glass IP 31 includes alkali-free glass or the like, and has a linear expansion coefficient similar to that of silicon. For example, a material having a linear expansion coefficient of 0.7 to $6 \times 10^{-6} (K^{-1})$ can be used for a linear expansion coefficient of 1 to $4.5 \times 10^{-6} (K^{-1})$ of silicon, but it is preferable that the linear expansion coefficient be close to that of silicon at a use temperature.

As for the light transmissive member 51, a material having a Young's modulus of 0.1 to 10 GPa can be used, but having the Young's modulus of 1 GPa or more is preferable because warpage of the CIS 41 can be suppressed, and a material quality not containing a halogen element is to be used.

The glass IP 31 and the light transmissive member 51 each can have an Abbe number of 40 or more, but the Abbe number of 55 or more is preferable because color dispersion can be reduced.

Alternatively, even in a case where the light transmissive member 51 has the Abbe number of 25 or more, color dispersion can be reduced by using a material having an Abbe number of 40 or more for the glass IP 31 in accordance with an achromatization condition.

Furthermore, the glass IP 31 and the light transmissive member 51 each can have transmissivity of 90% or more, preferably, 95% or more.

The light absorbing member 56 is an antireflection member including a multilayer film in which a refractive index (material) and a film thickness are controlled.

Since the light transmission member 51 is thus charged between the glass IP 31 and the CIS 41, entire rigidity can be enhanced, deformation is hardly caused by external force, and flatness of the CIS 41 can be maintained.

Additionally, even in a case where warpage stress of the CIS 41 is caused by a difference in a linear expansion coefficient from the glass IP 31, flatness of the CIS can be maintained because of support by the charged light transmission member 51.

3. Second Embodiment

In the above, described is an example in which a camera module 11 is formed as a single body of a glass IP 31, but that camera module may also have a configuration including a flexible printed circuit (FPC) and a physical sensor.

Figure 4:
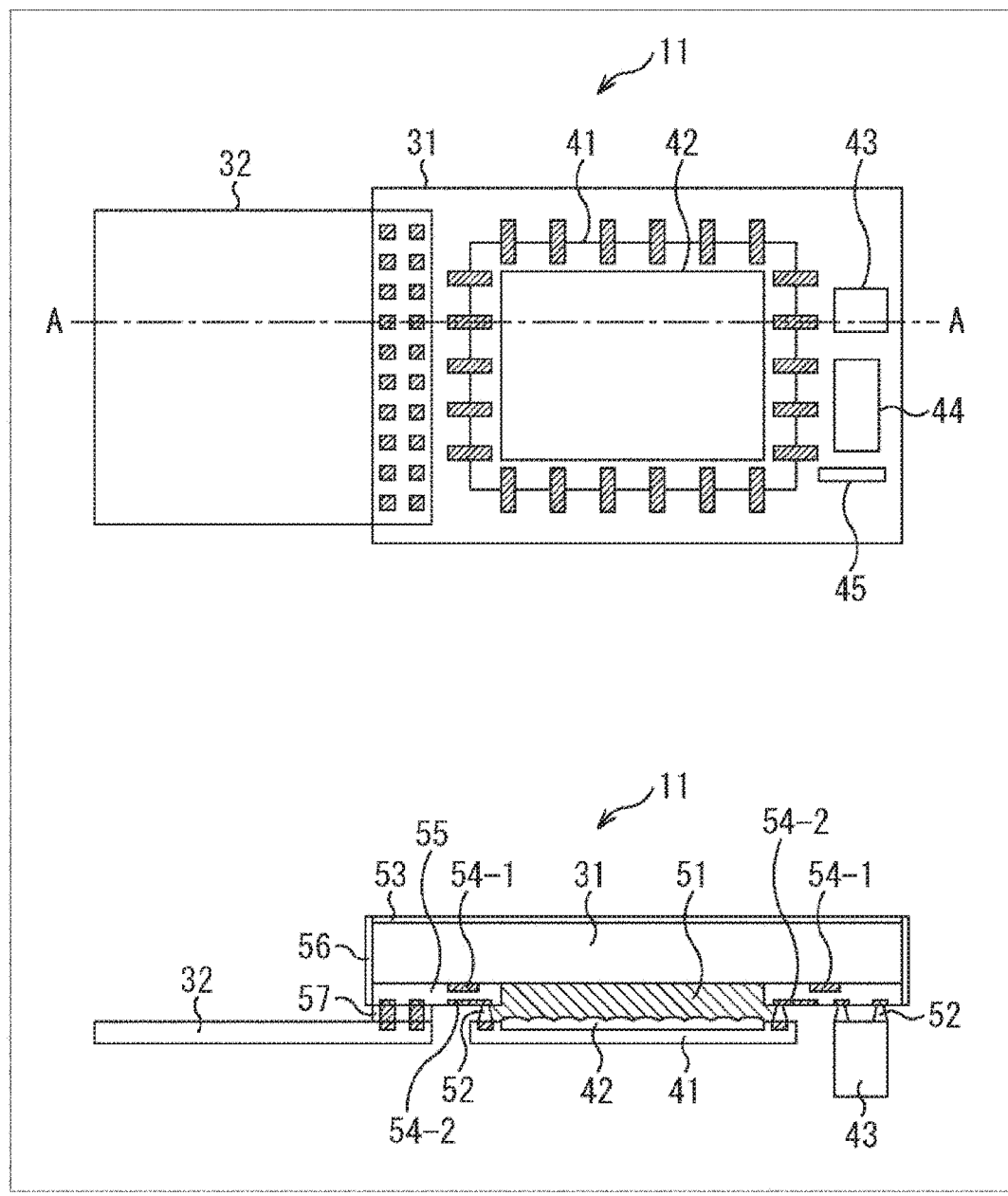
FIG. 4 is a diagram illustrating an exemplary configuration of a camera module according to a second embodiment to which the present disclosure is applied.

FIG. 4 illustrates an exemplary configuration of the camera module 11 including, in the glass IP, an FPC and a physical sensor. Note that a component having a function same as a component of a camera module 11 in FIG. 3 is denoted by a same reference sign and a same name, and a description therefor will be suitably omitted, and the same shall be applied in the following.

In the example of FIG. 4, a gyro sensor 43, a driving driver 44 including an auto focus (AF) mechanism, an optical image stabilizer (OIS), and the like, and a heat dissipation pad 45 are physically and electrically bonded to a wiring layer 54-2 of a glass IP 31 via a bump 52. The bump 52 is connected by Au bump connection with ultrasonic waves.

Incidentally, the gyro sensor 43, driving driver 44 including an auto focus (AF) mechanism, an optical image stabilizer (OIS), or the like, and heat dissipation pad 45 may be physical sensors or control components other than these, and for example, an acceleration sensor, a geomagnetic sensor, a hall element sensor, or the like may be applicable.

A material having a linear expansion coefficient in a range of 0.7 to $6 \times 10^{-6} (K^{-1})$ can be used for the gyro sensor 43, driving driver 44 including an auto focus (AF) mechanism, an optical image stabilizer (OIS), and the like, and heat dissipation pad 45, but it is preferable that the linear expansion coefficient be closer to a linear expansion coefficient of silicon at a use temperature.

As illustrated in FIG. 4, an FPC 32 is bonded to a wiring surface 54-2 located at a plate end of the glass IP 31 by, for example, an anisotropic conductive film 57 at a position interposing the CIS 41 and facing the gyro sensor 43, driving driver 44 including an auto focus (AF) mechanism, an optical image stabilizer (OIS), and the like, and heat dissipation pad 45 while interposing an image sensor 41.

Since entire rigidity is thus increased by charging a light transmissive member 51 between the glass IP 31 and the CIS 41 and deformation is hardly caused by external force, and the gyro sensor 43 is mounted on the glass IP 31 in which flatness is maintained, occurrence of erroneous detection such as offset of a signal can be suppressed.

Additionally, heat dissipation efficiency can be improved by the waste heat pad 45.

4. Third Embodiment

In the above, described is an example of a camera module 11 in which rigidity is enhanced by charging a light transmissive member 51 between a glass IP 31 and a CIS 41, but a glass wafer level lens may also be included.

Figure 5:
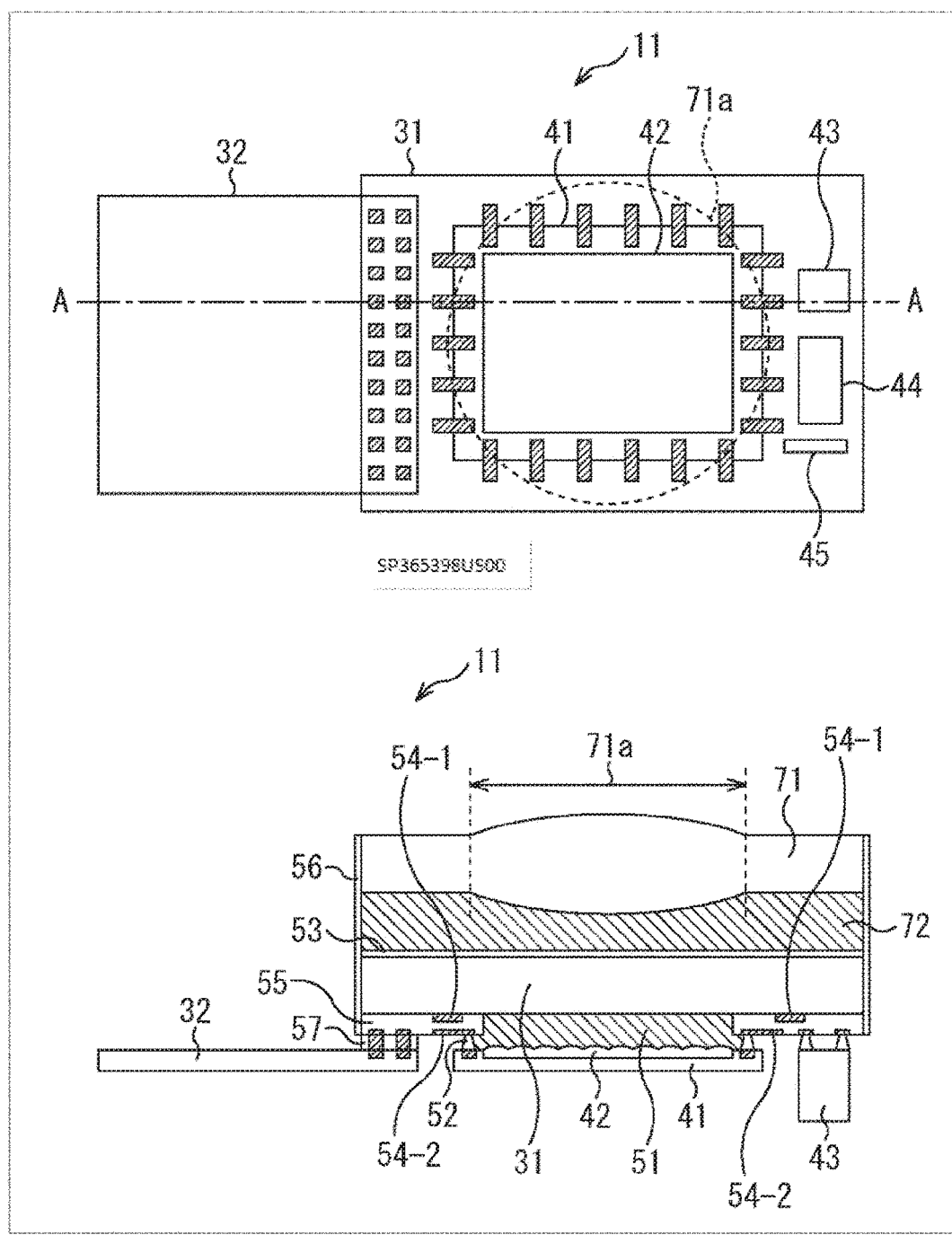
FIG. 5 is a diagram illustrating an exemplary configuration of the camera module according to a third embodiment to which the present disclosure is applied.

FIG. 5 illustrates an exemplary configuration of the camera module 11 including a glass wafer level lens.

The glass wafer level lens 71 is stacked on a surface of the glass IP 31 located on an opposite side of a surface provided with a wiring layer 54-1. A center portion of the glass wafer level lens 71 includes a circular projecting portion 71a.

A light transmissive member 72 similar to a light transmissive member 51 is charged between the glass wafer level lens 71 and an IR cut filter 53 located on an upper surface of the glass IP 31.

The glass wafer level lens 71 has ranges of a linear expansion coefficient, a Young's modulus, an Abbe number, and transmissivity similar to those of the glass IP 31 and light transmissive member 51.

Since rigidity can be further enhanced by thus bonding of the glass wafer level lens 71, deflection of the glass IP 31 caused by external force can be further suppressed, and it is possible to further suppress erroneous detection such as offset of a signal of the gyro sensor 43.

5. Fourth Embodiment

In the above, described is an example of a camera module 11 in which rigidity is enhanced by charging a light transmissive member 51 between a glass IP 31 and a CIS 41, but rigidity may also be enhanced by further providing a through glass via (TGV) and forming or charging a conductive member on or to an inner wall thereof.

Figure 6:
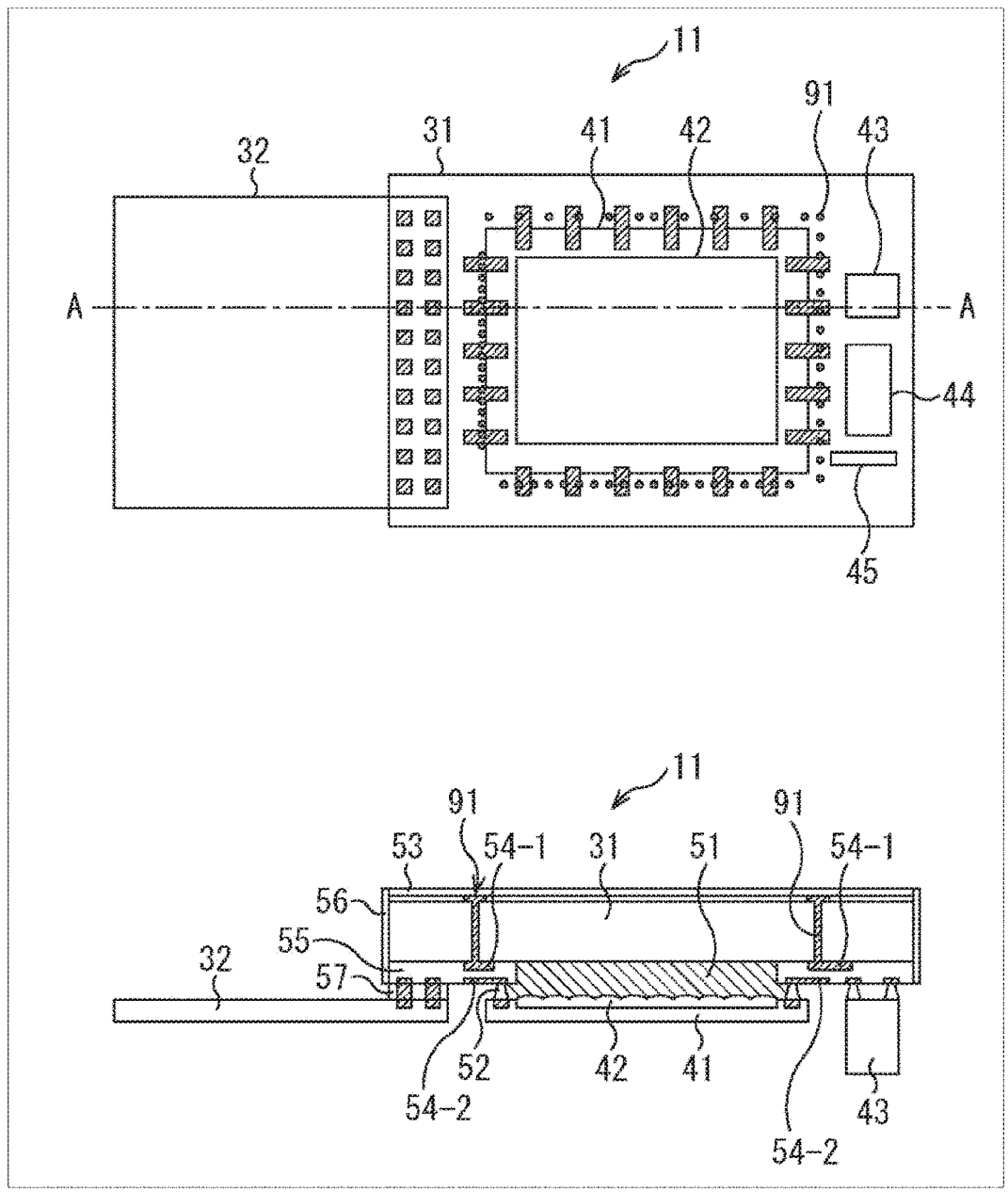
FIG. 6 is a diagram illustrating an exemplary configuration of a camera module according to a fourth embodiment to which the present disclosure is applied.

FIG. 6 illustrates an exemplary configuration of a camera module 11 in which a through glass via (TGV) is provided in a glass IP and a conductive member is formed on and charged to an inner wall thereof.

The glass IP 31 of the camera module 11 in FIG. 6 is provided with the through glass via (TGV), and a TGV attached with a conductive member 91 having a conductive member formed on or charged to the inner wall thereof is provided.

As illustrated in an upper portion of FIG. 6, TGVs each attached with a conductive member 91 are arranged at equal intervals or unequal intervals in a manner surrounding a light receiving surface of a CIS 41, and are arrayed in a plurality of columns.

Additionally, a metal such as copper (Cu) or aluminum (Al) but also polysilicon and the like are charged into conductive member TGV 91.

With this configuration, rigidity of the glass IP 31 can be enhanced and also a degree of freedom in wiring layout can be increased. As a result, a gyro sensor 43 and an FPC 32 can be connected to not only to a back surface of the glass IP 31 but also to an upper surface side thereof in the drawing.

6. Fifth Embodiment

In the above, described is an example of a camera module 11 in which rigidity is enhanced by charging a light transmissive member 51 between a glass IP 31 and a CIS 41, but rigidity may also be enhanced by further providing a through glass via (TGV) and charging a light absorbing member thereto.

Figure 7:
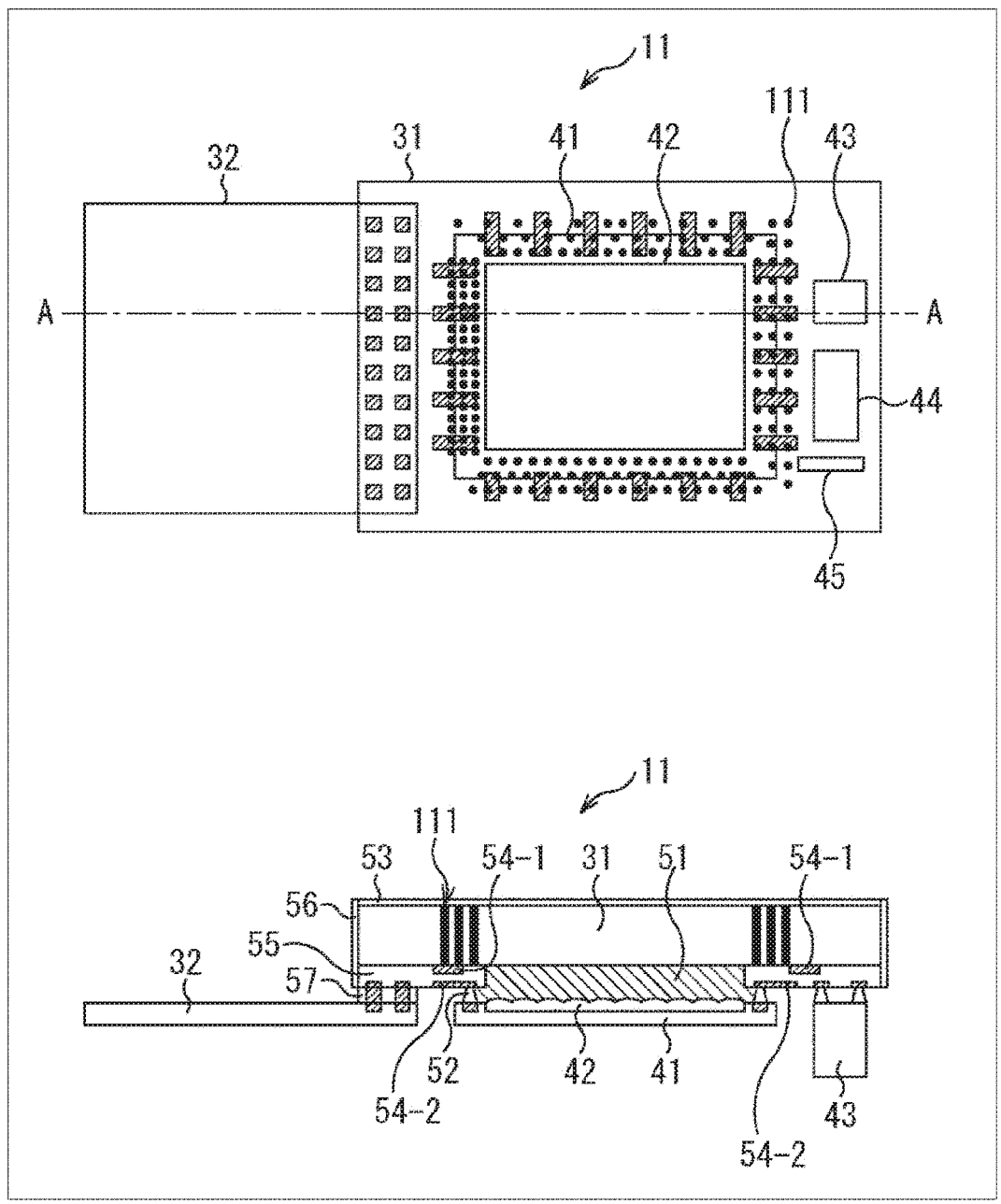
FIG. 7 is a diagram illustrating an exemplary configuration of a camera module according to a fifth embodiment to which the present disclosure is applied.

FIG. 7 illustrates an exemplary configuration of a camera module 11 in which a TGV is provided in a glass IP 31 and a light absorbing member is charged thereto.

In the camera module 11 of FIG. 7, the TGV is provided in the glass IP 31, and a TGV attached with a light absorbing member 111 charged with a light absorbing member is provided.

The TGV attached with a light absorbing member 111 is an antireflection member including a multilayer film in which a refractive index (material) and a film thickness are controlled, and is charged into a TGV under vacuum.

As illustrated in an upper portion of FIG. 7, TGVs each attached with a light absorbing member 111 are arranged in a plurality of columns (for example, three columns) at equal intervals or unequal intervals in a manner surrounding a light receiving surface of a CIS 41.

With this configuration, rigidity of the glass IP 31 can be enhanced and also stray light inside the glass IP 31 can be suppressed by the TGVs each attached with a light absorbing member 111.

7. Sixth Embodiment

In the above, described is an example in which a TGV attached with a conductive member or a TGV attached with a light absorbing member is provided in a camera module 11 having rigidity enhanced by charging a light transmissive member 51 between a glass IP 31 and a CIS 41, but both TGVs may also be provided.

Figure 8:
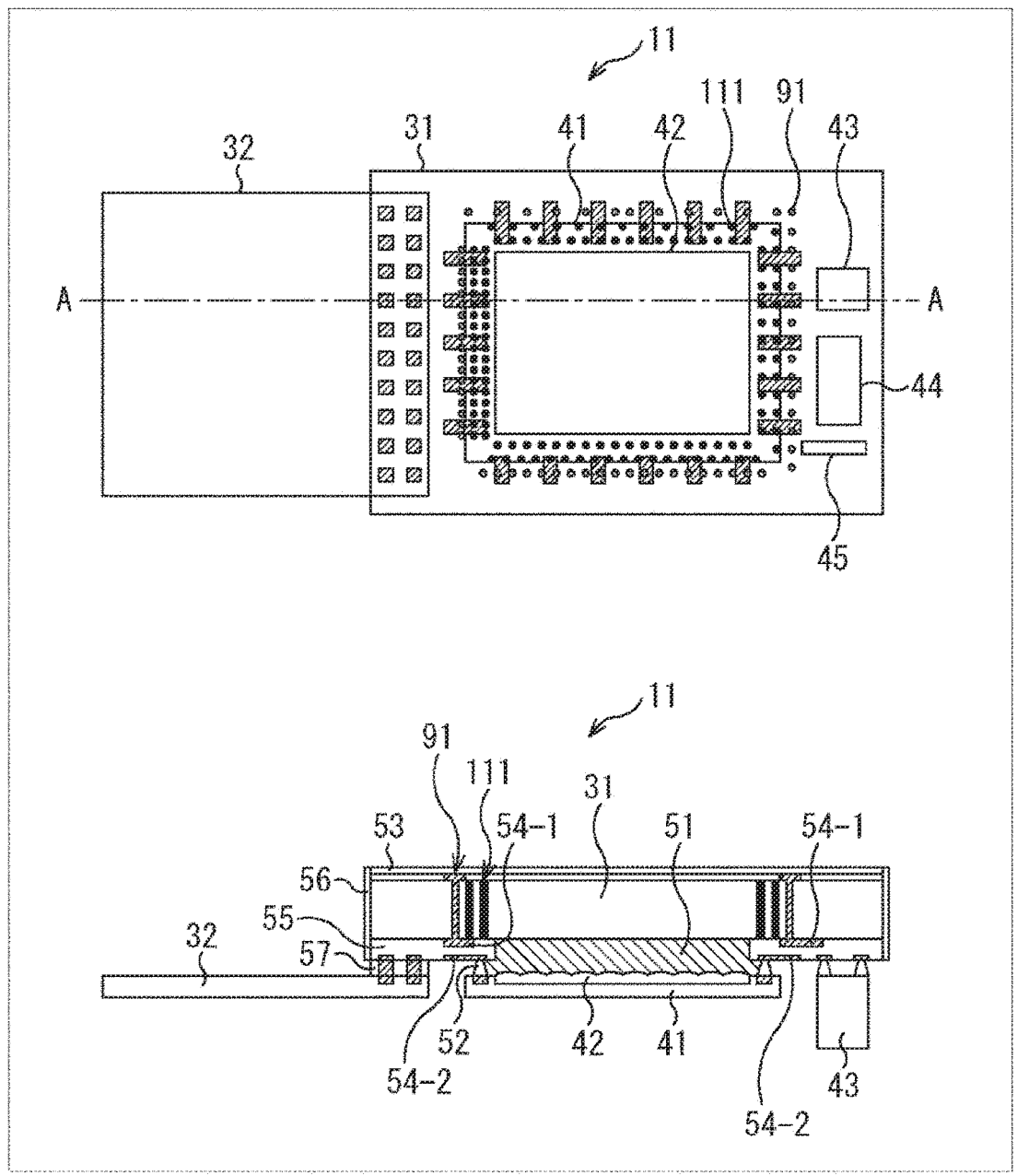
FIG. 8 is a diagram illustrating an exemplary configuration of a camera module according to a sixth embodiment to which the present disclosure is applied.

FIG. 8 illustrates an exemplary configuration of a camera module 11 in which both of a TGV attached with a conductive member 91 and a TGV attached with a light absorbing member 111 are formed in a glass IP 31.

In the camera module 11 of FIG. 8, a TGV attached with a conductive member 91 and a TGV attached with a light absorbing member 111 are formed in a glass IP 31, and as illustrated in an upper portion of FIG. 8, the respective kinds of TGVs are arranged in a plurality of columns (for example, three columns) at equal intervals or unequal intervals in a manner surrounding a light receiving surface of a CIS 41, and the TGVs each attached with a light absorbing member 111 is arranged on a more inner side than the TGVs each attached with a conductive member 91 are arranged.

With this configuration, rigidity of the glass IP 31 is further enhanced, a degree of freedom in wiring layout can be increased the TGVs each attached with a conductive member 91, and also stray light inside the glass IP 31 can be suppressed by the TGVs each attached with a light absorbing member 111.

8. Seventh Embodiment

In the above, described is an example of a camera module 11 in which rigidity is enhanced by charging a light transmissive member 51 between a glass IP 31 and a CIS 41, but it may be possible to be apply a stereo type camera module including a plurality of light receiving surfaces.

Figure 9:
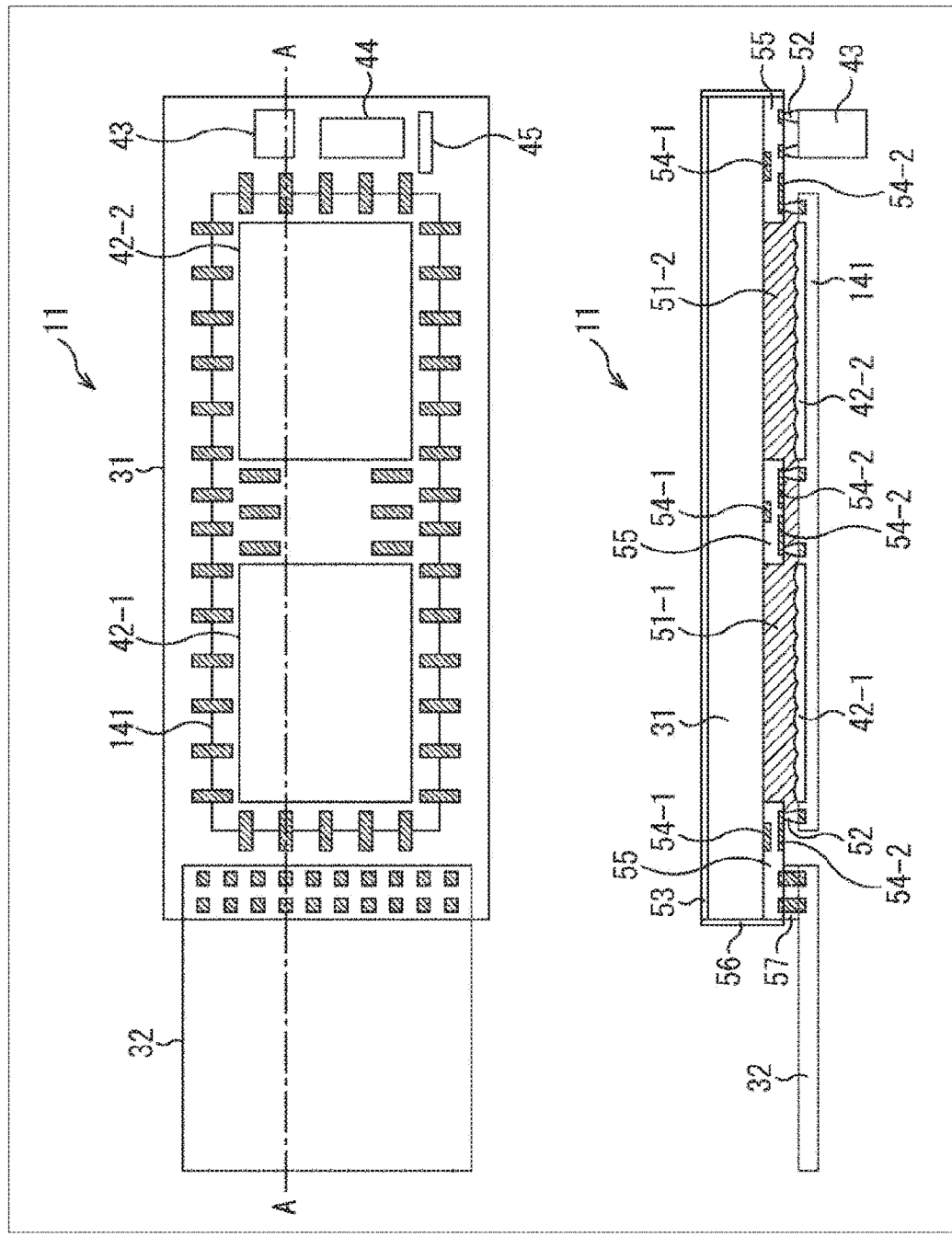
FIG. 9 is a diagram illustrating an exemplary configuration of a camera module according to a seventh embodiment to which the present disclosure is applied.

FIG. 9 illustrates an exemplary configuration of a stereo type camera module 11.

In the camera module 11 of FIG. 9, a CIS 141 of a stereo camera type is provided instead of a CIS 41 in a camera module of FIG. 3. Light receiving surfaces corresponding to a right eye and a left eye respectively are set, and color filters 42-1 and 42-2 are provided respectively.

However, basic configurations of the CIS 41 and the CIS 141 are the same except that the CIS 141 has the plurality of light receiving surfaces.

In other words, light transmissive members 51-1, 51-2 are charged between the glass IP 31 and each of the color filters 42-1, 42-2 of the CIS 141, respectively. Therefore, rigidity of the glass IP 31 provided with the CIS 141 is enhanced, and flatness of the CIS 141 can be maintained even in a case warpage stress of the CIS 141 is caused by a difference in a linear expansion coefficient from that of the glass IP 31, and furthermore, erroneous detection in a gyro sensor 43 can be suppressed.

Additionally, since the plurality of light receiving surfaces is provided, a deviation in an optical axis between left and right sides can be suppressed more than in a case where a CIS 41 is individually mounted. As a result, for example, imaging can be performed with high accuracy even at the time of capturing a depth image with a stereo camera.

Meanwhile, a conductive member TGV 91 and a TGV attached with a light absorbing member 111 may also be formed in the glass IP 31 of the camera module 11 in FIG. 9, and similar effects can be obtained.

Additionally, with this configuration, for example, the camera module is equipped on a vehicle and can also be used with high accuracy as a stereo camera to image a distance to an obstacle in front during travel, a preceding vehicle in following traveling, and the like.

Furthermore, in the above, the example of having the two light receiving surfaces is described, but more than two light receiving surfaces may be provided.

9. Eighth Embodiment

In the above, described is an example of a camera module 11 in which rigidity is enhanced by charging a light transmissive member 51 between a glass IP 31 and a CIS 41, but a redistribution layer (RDL) may be further provided by applying a coating resin (fan-out resin) to a back surface of the CIS 41.

Figure 10:
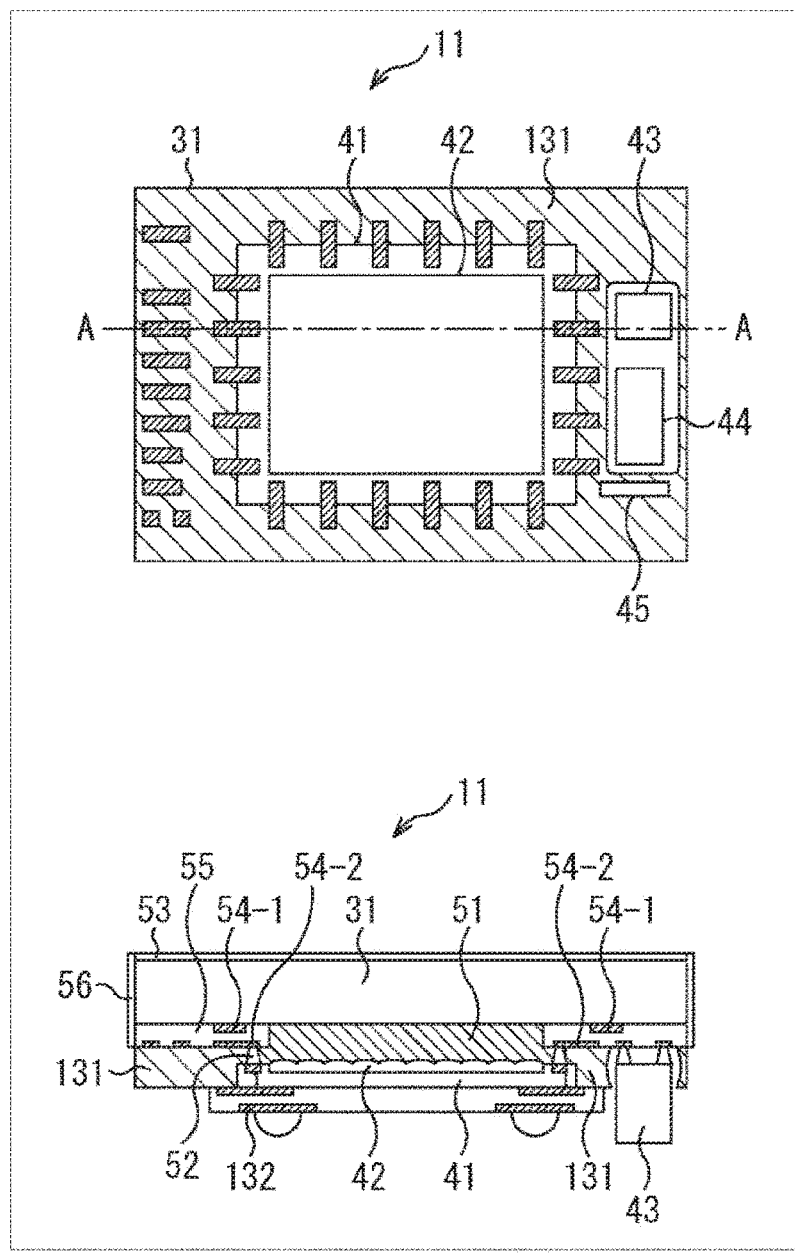
FIG. 10 is a diagram illustrating an exemplary configuration of a camera module according to an eighth embodiment to which the present disclosure is applied.

FIG. 10 illustrates an exemplary configuration of a camera module 11 in which a redistribution layer (RDL) is provided by applying a coating resin (fan-out resin) to a back surface of a CIS 41.

In the camera module 11 illustrated in FIG. 10, a coating resin wiring (fan-out resin wiring) 131 is formed on the back surface of the CIS 41 by applying the coating resin, and a redistribution layer (RDL) 132 is further provided and electrically connected to a wiring layer 54-2.

With this configuration, rigidity of a glass IP 31 is enhanced and also the number of input/output terminals can be increased by the coating resin wiring 131.

10. Ninth Embodiment

In the above, described is an example of a camera module 11 in which rigidity is enhanced by charging a light transmissive member 51 between a glass IP 31 and a CIS 41, but a TGV attached with a conductive member, a TGV attached with a light absorbing member, or a cavity may be further provided in a region of the glass IP 31 where a gyro sensor 43 is connected.

Figure 11:
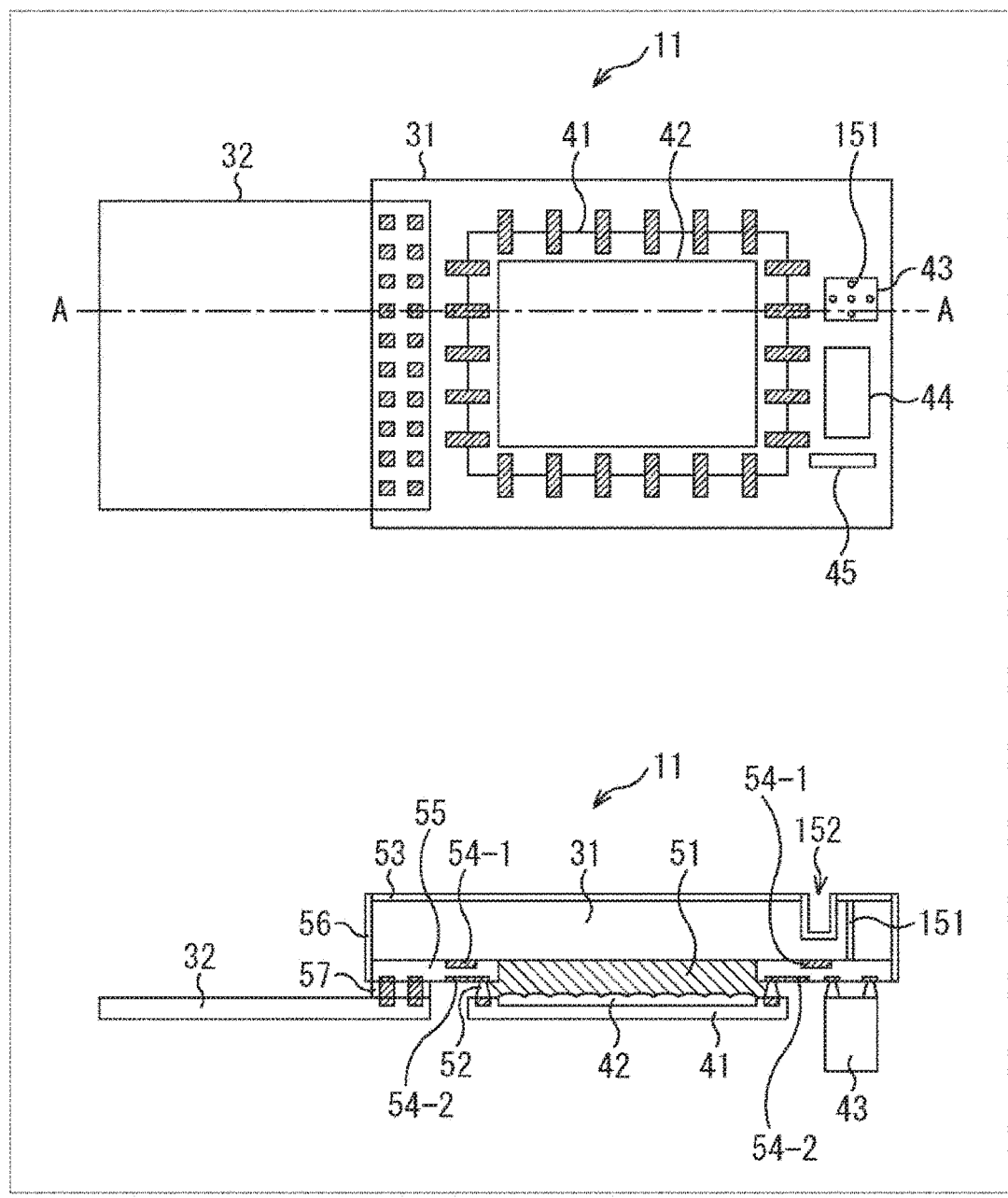
FIG. 11 is a diagram illustrating an exemplary configuration of a camera module according to a ninth embodiment to which the present disclosure is applied.

FIG. 11 illustrates an exemplary configuration of a camera module 11 in which a TGV attached with a conductive member, a TGV attached with a light absorbing member, or a cavity is provided in a region of the glass IP 31 connected to the gyro sensor 43.

In the camera module 11 of FIG. 11, a TGV 151 and a cavity 152 are formed in the glass IP 31, and each of TGV 151 and a cavity 152 includes any one of a TGV attached with a conductive member and a TGV attached with a light absorbing member or combination both thereof.

The TGV 151 and cavity 152 are arranged locally, particularly, immediately below or around the gyro sensor 43.

Meanwhile, the cavity 152 may have an inner wall including a light absorbing member or a conductive member, or may be charged with a light absorbing member or a conductive member.

With this configuration, even in a case where a linear expansion coefficient of the glass IP 31 is in a predetermined range, thermal stress deformation caused by a difference from silicon can be suppressed to a little deformation amount by controlling rigidity of the glass IP 31 in the vicinity of the gyro sensor 43 by the TGV 151 and cavity.152. As a result, erroneous detection such as offset of a gyro signal of the gyro sensor 43 can be suppressed.

Additionally, in a case where a light absorbing member is used, stray light inside the glass IP 31 can be suppressed.

11. Exemplary Application

<Exemplary Application to Electronic Apparatus>

A camera module 11 using a CIS 41 or a CIS 141 described above can be applied to various kinds of electronic apparatuses such as imaging devices such as a digital still camera and a digital video camera (digital camera), a mobile phone (portable information terminal) having an imaging function, or another apparatus having an imaging function (for example, an in-vehicle camera and the like), for example.

Figure 12:
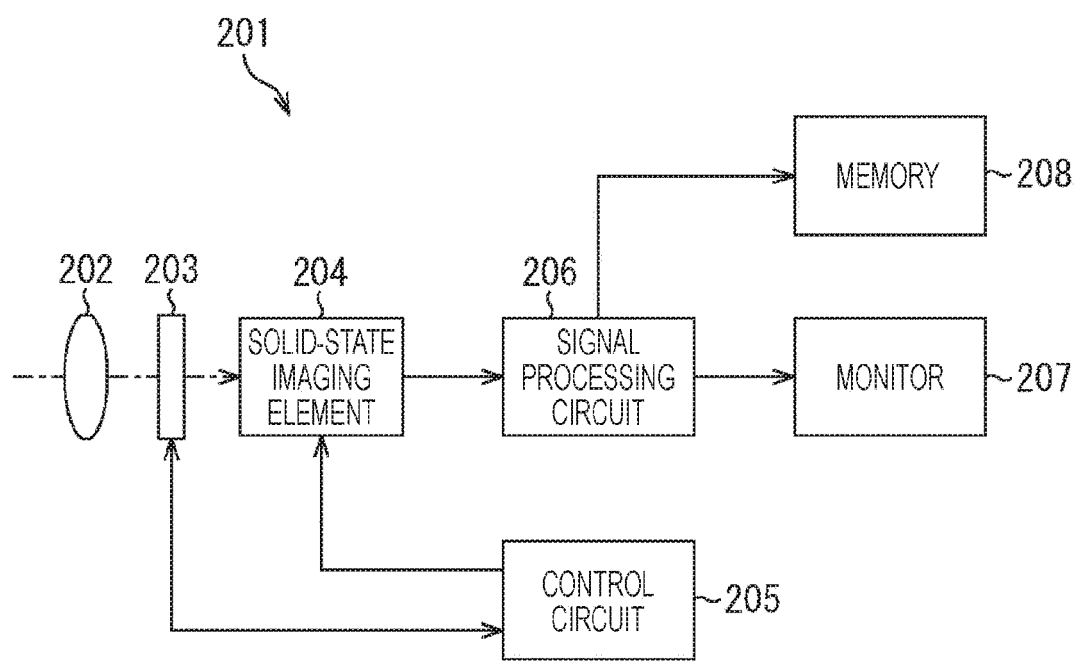
FIG. 12 is an exemplary configuration of an imaging device using a camera module to which the present disclosure is applied.

FIG. 12 is a block diagram illustrating an exemplary configuration of an imaging device as an electronic apparatus to which the present technology is applied.

An imaging device 201 illustrated in FIG. 12 includes an optical system 202, a shutter device 203, a solid-state imaging element 204, a drive circuit 205, a signal processing circuit 206, a monitor 207, and a memory 208, and can capture a still image and a moving image.

The optical system 202 includes one or a plurality of lenses, and guides light (incident light) from a subject to the solid-state imaging element 204, and forms an image on a light receiving surface of the solid-state imaging element 204.

The shutter device 203 is arranged between the optical system 202 and the solid-state imaging element 204, and controls a light emission period and a light shielding period relative the solid-state imaging element 204 in accordance with control of the drive circuit 1005.

The solid-state imaging element 204 includes a package including the above-described solid-state imaging element. The solid-state imaging element 204 accumulates signal charge for a predetermined period in accordance with light from which an image is formed on the light receiving surface via the optical system 202 and shutter device 203. The signal charge accumulated in the solid-state imaging element 204 is transferred in accordance with a drive signal (timing signal) supplied from the drive circuit 205.

The drive circuit 205 outputs a drive signal to control transfer operation of the solid-state imaging element 204 and shutter operation of the shutter device 203, and drives the solid-state imaging element 204 and shutter device 203.

The signal processing circuit 206 applies various kinds of signal processing to signal charge output from the solid-state imaging element 204. An image (image data) obtained by applying the signal processing by the signal processing circuit 206 is supplied and displayed on the monitor 207, or supplied and stored (recorded) in the memory 208.

In the imaging device 201 thus configured, distortion of a glass IP 31 can be also suppressed by applying a camera module using a CIS 41 or a CIS 141 in place of the above-described solid-state imaging element 204, and even in a case of mounting a gyro sensor together and the like therewith, erroneous detection of a gyro signal can be reduced.

<Exemplary Uses of Camera Module>

Figure 13:
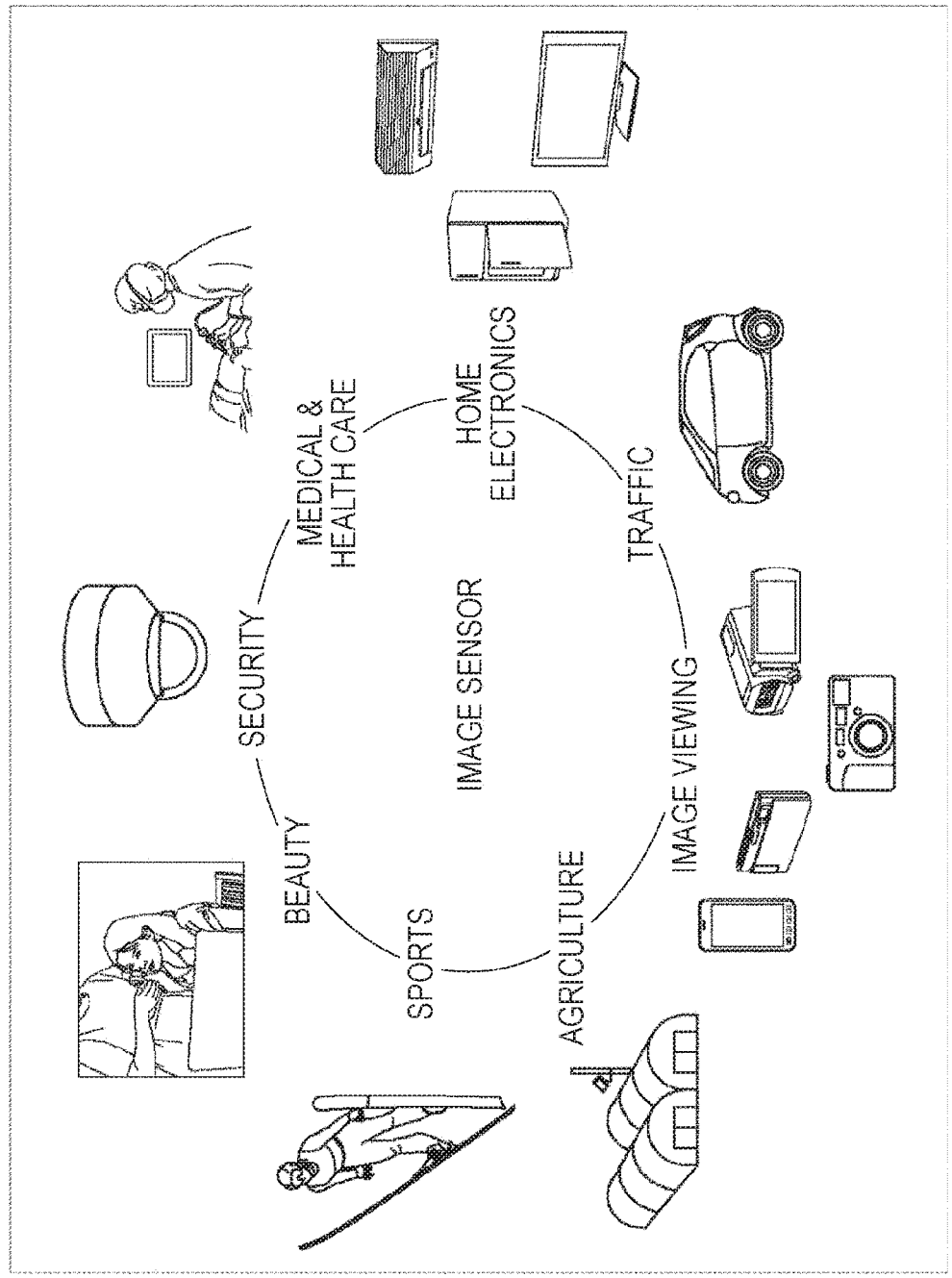
FIG. 13 is a diagram illustrating exemplary uses of a camera module to which the present disclosure is applied.

FIG. 13 is a diagram illustrating exemplary uses of a camera module using a CIS 41 or a CIS 141 described above.

The above-described camera module can be used in various cases of sensing light such as visible light, infrared light, ultraviolet light, and X-rays as described below, for example.

- Device adapted to photograph an image provided for image viewing, such as a digital camera, a portable device incorporated with a camera function
- Device provided for traffic, such as an on-vehicle sensor adapted to image a front side, a rear side, a periphery of a vehicle, a car interior, and the like, a monitoring camera adapted to monitor a traveling vehicle and a road, and a ranging sensor adapted to measure an inter-vehicle distance or the like in order to perform safety drive like automatic stop recognize driver's condition and the like
- Device provided for home electronics such as a television, a refrigerator, and an air conditioner in order to image a user's gesture and operate the electric appliances in accordance with the gesture
- Device provided for medical and health care, such as an endoscope and a device adapted to image a blood vessel by receiving infrared light
- Device provided for security, such as a monitoring camera for crime prevention, and a camera for person authentication
- Device provided for beauty care, such as skin measurement instrument adapted to image skin, and a microscope adapted to image a scalp
- Device provided for sports and the like, such as an action camera and a wearable camera used in sports
- Device provided for agriculture, such as a camera to monitor condition of fields and crops.

Note that the present disclosure can also have the following configurations.

<1> A glass interposer module including:
an image sensor adapted to capture an image;
a glass interposer equipped with the image sensor in a manner facing a light receiving surface of the image sensor;
a light transmissive member charged between the light receiving surface of the image sensor and the glass interposer.

<2> The glass interposer module recited in <1>, in which the glass interposer is equipped with a physical sensor.

<3> The glass interposer module recited in <2>, in which the physical sensor is arranged at a position facing an end portion of the glass interposer connected by a flexible printed wiring board (FPC) while interposing the image sensor.

<4> The glass interposer module recited in <2>, in which the physical sensor includes a material having a linear expansion coefficient of 0.7 to $6 \times 10^{-6} (K^{-1})$.

<5> The glass interposer module recited in any one of <1> to <4>, in which a driving driver for an auto focus (AF) mechanism or an optical image stabilizer (OIS) mechanism is equipped on the glass interposer.

<6> The glass interposer module recited in any one of <1> to <5>, in which a pad for heat dissipation is equipped on the glass interposer.

<7> The glass interposer module recited in any one of <1> to <6>, in which a glass wafer level lens is bonded to the glass interposer.

<8> The glass interposer module recited in any one of <1> to <7>, in which an infrared (IR) cut filter is attached or applied to the glass interposer.

<9> The glass interposer module recited in any one of <1> to <8>, in which a through glass via is formed in the glass interposer, and a conductive member is formed on or charged to an inner wall of the through glass via.

<10> The glass interposer module recited in any one of <1> to <9>, in which a through glass via is formed in the glass interposer, and a light absorbing film is formed on or a light absorbing agent is charged to an inner wall of the through glass via.

<11> The glass interposer module recited in <10>, in which the through glass via where the light absorbing film is formed or the light absorbing member is charged is arranged at a distance closer to an inner light receiving surface than the through glass via where the conductive member is formed or the conductive member is charged is arranged.

<12> The glass interposer module recited in any one of <1> to <11>, in which the image sensor includes a plurality of light receiving portions.

<13> The glass interposer module recited in <12>, in which a region located between the plurality of light receiving portions is connected by bump-connection.

<14> The glass interposer module recited in any one of <1> to <13>, in which a redistribution layer is formed on a back side of the image sensor.

<15> The glass interposer module recited in any one of <1> to <14>, in which a through glass via or a cavity is formed in the glass interposer.

<16> The glass interposer module recited in any one of <1> to <15>, in which the glass interposer is alkali-free glass.

<17> The glass interposer module recited in any one of <1> to <16>, in which the glass interposer includes a material having a linear expansion coefficient of 0.7 to $6 \times 10^{-6} (K^{-1})$.

<18> The glass interposer module recited in any one of <1> to <17>, in which the glass interposer includes a material having an Abbe number of 40 or more.

<19> The glass interposer module recited in any one of <1> to <18>, in which the light transmissive member includes a material having a Young's modulus of 0.1 to 10 GPa.

<20> The glass interposer module recited in <1> to <19>, in which the light transmissive member includes a material having an Abbe number of 40 or more.

<21> The glass interposer module recited in any one of <1> to <20>, in which the glass interposer includes a material having an Abbe number of 40 or more, and the light transmissive member includes a material having an Abbe number of 25 or more.

<22> The glass interposer module recited in any one of <1> to <21>, in which the light transmissive member includes a material not containing a halogen element.

<23> A digital camera, a mobile information terminal, or an in-vehicle camera equipped with a glass interposer module recited in <1>.

<24> An imaging device including:
an image sensor adapted to capture an image;
a glass interposer equipped with the image sensor in a manner facing a light receiving surface of the image sensor;
a light transmissive member charged between the light receiving surface of the image sensor and the glass interposer.

<25> An electronic apparatus including:
an image sensor adapted to capture an image;
a glass interposer equipped with the image sensor in a manner facing a light receiving surface of the image sensor; and
a light transmissive member charged between the light receiving surface of the image sensor and the glass interposer.

REFERENCE SIGNS LIST

11 Camera module
31 Glass IP
32 FPC
41 CIS
42, 42-1, 42-2 Color filter
51, 51-1, 51-2 Light transmissive member
52 Bump
53 IR cut filter
54, 54-1, 54-2 Wiring layer
55 Insulation layer
56 Light absorbing member
57 Anisotropic conductive film
71 Glass wafer level lens
72 Light transmissive member
91 TGV attached with conductive member
111 TGV attached with light absorbing member
131 Coating resin wiring
132 Redistribution layer
141 CIS
151 TGV
152 Cavity

The invention claimed is:

1. A glass interposer module, comprising:
an image sensor configured to capture an image, wherein
the image sensor includes a plurality of light receiving portions, and
a region between the plurality of light receiving portions includes a first bump-connection;
a glass interposer on the image sensor;
an insulation layer in contact with a first surface of the glass interposer, wherein
the insulation layer includes a first wiring layer and a second wiring layer,
the first wiring layer is on a first surface of the insulation layer,
the second wiring layer is on a second surface of the insulation layer,
the second surface of the insulation layer is opposite to the first surface of the insulation layer,
the second wiring layer is electrically connected to the image sensor via a bump,
a first portion of the second wiring layer is at a first end portion of the glass interposer, and
the first surface of the glass interposer faces the plurality of light receiving portions of the image sensor;
a physical sensor connected to the first portion of the second wiring layer;
a color filter on each of the plurality of light receiving portions of the image sensor;
a first light transmissive member between the color filter, on each of the plurality of light receiving portions of the image sensor, and the first surface of the glass interposer;
an infrared (IR) cut filter on a second surface of the glass interposer, wherein the second surface of the glass interposer is opposite to the first surface of the glass interposer;
a second light transmissive member on the IR cut filter; and
a glass wafer level lens on the second light transmissive member.

2. The glass interposer module according to claim 1, wherein
the physical sensor is physically and electrically connected to the first portion of the second wiring layer via a second bump-connection,
a second portion of the second wiring layer is at a second end portion of the glass interposer, and
the second portion of the second wiring layer is connected to a flexible printed circuit (FPC).

3. The glass interposer module according to claim 1, wherein the physical sensor includes a material having a linear expansion coefficient of 0.7 to $6 \times 10^{-6}$ $(K^{-1})$.

4. The glass interposer module according to claim 1, wherein a driving driver, for at least one of an auto focus (AF) mechanism or an optical image stabilizer (OIS) mechanism, is on the first surface of the glass interposer.

5. The glass interposer module according to claim 1, wherein a pad for heat dissipation is on the first surface of the glass interposer.

6. The glass interposer module according to claim 1, wherein the glass interposer includes:
a through glass via; and
a conductive member on an inner wall of the through glass via.

7. The glass interposer module according to claim 1, wherein the glass interposer includes:
a first through glass via; and
a light absorbing member on an inner wall of the first through glass via.

8. The glass interposer module according to claim 7, wherein
the glass interposer further includes:
a second through glass via; and
a conductive member on an inner wall of the second through glass via, and
the first through glass via is closer to the plurality of light receiving portions of the image sensor than the second through glass via.

9. The glass interposer module according to claim 1, further comprising a redistribution layer on a surface of the image sensor opposite to the plurality of light receiving portions of the image sensor.

10. The glass interposer module according to claim 1, wherein the glass interposer includes at least one of a through glass via or a cavity.

11. The glass interposer module according to claim 1, wherein the glass interposer is alkali-free glass.

12. The glass interposer module according to claim 1, wherein the glass interposer includes a material having a linear expansion coefficient of 0.7 to $6\times10^{-6}(K^{-1})$.

13. The glass interposer module according to claim 1, wherein the glass interposer includes a material having an Abbe number of 40 or more.

14. The glass interposer module according to claim 1, wherein the first light transmissive member includes a material having a Young's modulus of 0.1 to 10 GPa.

15. The glass interposer module according to claim 1, wherein the first light transmissive member includes a material having an Abbe number of 40 or more.

16. The glass interposer module according to claim 1, wherein
the glass interposer includes a material having an Abbe number of 40 or more, and
the first light transmissive member includes a material having an Abbe number of 25 or more.

17. The glass interposer module according to claim 1, wherein the first light transmissive member includes a material different from a halogen element.

18. The glass interposer module according to claim 1, wherein
the glass wafer level lens is on an entire top surface of the second light transmissive member, and
the glass wafer level lens is in contact with the second light transmissive member.

19. A digital camera, a mobile information terminal, or an in-vehicle camera comprising the glass interposer module according to claim 1.

20. An imaging device, comprising:
an image sensor configured to capture an image, wherein
the image sensor includes a plurality of light receiving portions, and
a region between the plurality of light receiving portions includes a bump-connection;
a glass interposer on the image sensor;
an insulation layer in contact with a first surface of the glass interposer, wherein
the insulation layer includes a first wiring layer and a second wiring layer,
the first wiring layer is on a first surface of the insulation layer,
the second wiring layer is on a second surface of the insulation layer,
the second surface of the insulation layer is opposite to the first surface of the insulation layer,
the second wiring layer is electrically connected to the image sensor via a bump,
a portion of the second wiring layer is at an end portion of the glass interposer, and
the first surface of the glass interposer faces the plurality of light receiving portions of the image sensor;
a physical sensor connected to the portion of the second wiring layer;
a color filter on each of the plurality of light receiving portions of the image sensor;
a first light transmissive member between the color filter, on each of the plurality of light receiving portions of the image sensor, and the first surface of the glass interposer;
an infrared (IR) cut filter on a second surface of the glass interposer, wherein the second surface of the glass interposer is opposite to the first surface of the glass interposer;
a second light transmissive member on the IR cut filter; and
a glass wafer level lens on the second light transmissive member.

21. An electronic apparatus, comprising:
an image sensor configured to capture an image, wherein
the image sensor includes a plurality of light receiving portions, and
a region between the plurality of light receiving portions includes a bump-connection;
a glass interposer on the image sensor;
an insulation layer in contact with a first surface of the glass interposer, wherein
the insulation layer includes a first wiring layer and a second wiring layer,
the first wiring layer is on a first surface of the insulation layer,
the second wiring layer is on a second surface of the insulation layer,
the second surface of the insulation layer is opposite to the first surface of the insulation layer,
the second wiring layer is electrically connected to the image sensor via a bump,
a portion of the second wiring layer is at an end portion of the glass interposer, and
the first surface of the glass interposer faces the plurality of light receiving portions of the image sensor;
a physical sensor connected to the portion of the second wiring layer;
a color filter on each of the plurality of light receiving portions of the image sensor;
a first light transmissive member between the color filter, on each of the plurality of light receiving portions of the image sensor, and the first surface of the glass interposer;
an infrared (IR) cut filter on a second surface of the glass interposer, wherein the second surface of the glass interposer is opposite to the first surface of the glass interposer;
a second light transmissive member on the IR cut filter; and
a glass wafer level lens on the second light transmissive member.

* * * * *